(12) United States Patent
Meninger et al.

(10) Patent No.: US 7,961,033 B2
(45) Date of Patent: Jun. 14, 2011

(54) DLL-BASED TEMPERATURE SENSOR

(75) Inventors: Scott Meninger, Lancaster, MA (US);
Kyoungho Woo, Sungnam (KR)

(73) Assignee: Cavium Networks, Inc., Mountain View, CA (US)

( * ) Notice: Subject to any disclaimer, the term of this patent is extended or adjusted under 35 U.S.C. 154(b) by 0 days.

(21) Appl. No.: 12/586,169

(22) Filed: Sep. 17, 2009

(65) Prior Publication Data
US 2010/0141328 A1 Jun. 10, 2010

Related U.S. Application Data

(60) Provisional application No. 61/192,685, filed on Sep. 19, 2008.

(51) Int. Cl.
*G05F 1/10* (2006.01)
(52) U.S. Cl. ........................ 327/512; 374/170
(58) Field of Classification Search ................. 327/149, 327/161, 512, 513; 374/170, 171
See application file for complete search history.

(56) References Cited

U.S. PATENT DOCUMENTS

| | | | | |
|---|---|---|---|---|
| 4,330,750 | A * | 5/1982 | Mayor | 327/276 |
| 6,092,030 | A * | 7/2000 | Lepejian et al. | 702/79 |
| 6,459,319 | B2 * | 10/2002 | Sako | 327/276 |
| 6,486,716 | B1 * | 11/2002 | Minami et al. | 327/152 |
| 6,891,774 | B1 * | 5/2005 | Abdollahi-Alibeik et al. | 365/189.02 |
| 7,605,625 | B2 * | 10/2009 | Pellerano et al. | 327/158 |
| 7,616,036 | B1 * | 11/2009 | Tabatabaei | 327/158 |
| 7,619,486 | B1 * | 11/2009 | Lesea | 331/176 |
| 7,629,825 | B1 * | 12/2009 | Fung et al. | 327/276 |
| 7,639,054 | B1 * | 12/2009 | Burney | 327/161 |
| 7,772,915 | B2 * | 8/2010 | Kim | 327/512 |
| 2006/0170472 | A1 * | 8/2006 | Suda et al. | 327/158 |
| 2009/0141770 | A1 * | 6/2009 | Chen et al. | 374/170 |

OTHER PUBLICATIONS

Arabi, K. et al., "Built-in Temperature Sensors for On-line Thermal Monitoring of Microelectronic Structures," *IEEE ICOCD. Proceedings of IEEE 1997*, pp. 462-467 (Sep. 1997).
Bakker, A., "CMOS Smart Temperature Sensors—An Overview," *IEEE Sensors 02. Proceedings of IEEE 2002*, pp. 1423-1427 (Jun. 2002).
Chen, P. et al., "A Time-to-Digital Converter-Based CMOS Smart Temperature Sensor," *IEEE J. Solid-State Circuits*, vol. 40, No. 8, pp. 1642-1648 (Aug. 2005).
Chen, P. et al., "A Time Domain Mixed-Mode Temperature Sensor with Digital Set-Point Programming," *IEEE 2006 CICC. Proceedings of IEEE 2006*, pp. 821-824 (Sep. 2006).
Filanovsky, I. M. et al., "Mutual Compensation of Mobility and Threshold Voltage Temperature Effects with Applications in CMOS Circuits," *IEEE Trans. on Circuits and Systems I.*, vol. 48, No. 7, pp. 876-884 (Jul. 2001).

(Continued)

*Primary Examiner* — Thomas J Hiltunen
(74) *Attorney, Agent, or Firm* — Hamilton, Brook, Smith & Reynolds, P.C.

(57) ABSTRACT

A temperature sensor includes an open-loop delay line comprising plural delay cells and a multiplexer configured to select a first number of the plural delay cells; a delay-locked loop comprising plural delay cells and a multiplexer configured to select a second number of the plural delay cells; a clock coupled to an input of the open-loop delay line and to an input of the delay-locked loop; a detector having a first input coupled to an output of the open-loop delay line and a second input coupled to an output of the delay-locked loop; and a finite state machine configured to detect a transition in the output of the phase detector.

8 Claims, 10 Drawing Sheets

OTHER PUBLICATIONS

Hamann, H.F. et al., "Power Distribution Measurements of the Dual Core PowerPC 970MP Microprocessor," *IEEE ISSCC Dig. Tech. Papers*, pp. 2172-2179 (Feb. 2006).

Hamann, H.F. et al., "Hotspot-Limited Microprocessors: Direct Temperature and Power Distribution Measurements," *IEEE J. Solid-State Circuits*, vol. 42, No. 1, pp. 56-65 (Jan. 2007).

Lin, S.-C. et al., "A Self-Consistent Substrate Thermal Profile Estimation Technique for Nanoscale ICs," *IEEE Trans. on Electron Devices*, vol. 54, No. 12, pp. 3342-3350 (Dec. 2007).

McGowen, R. et al., "Power and Temperature Control on a 9-nm Itanium-Family Processor," *IEEE J. Solid-State Circuits*, vol. 41, No. 1, pp. 229-237 (Jan. 2006).

Pertijs, M.A.P. et al., "Precision Temperature Measurement Using CMOS Substrate PNP Transistors," *IEEE Sensors Journal*, vol. 4, No. 3, pp. 294-300 (Jun. 2004).

Pertijs, M.A.P. et al. "A CMOS Smart Temperature Sensor with a 3σ Inaccuracy of ±0.5° C from −50° C to 120° C," *IEEE J. Solid-State Circuits*, vol. 40, No. 2, pp. 454-461 (Feb. 2005).

Poirier, C. et al., "Power and Temperature Control on a 90 nm Itanium-Family Processor," *IEEE ISSCC Dig. Tech. Papers*, pp. 304-305 (Feb. 2005).

Sidiropoulos, S. et al., "A Semidigital Dual Delay-Locked Loop," *IEEE J. Solid-State Circuits*, vol. 32, No. 11, pp. 1683-1692 (Nov. 1997).

Székely, V. et al., "CMOS Sensors for On-Line Thermal Monitoring of VLSI Circuits," *IEEE Trans. on VLSI Systems*, vol. 5, No. 3, pp. 270-276 (Sep. 1997).

Tuthill, M., "A Switched-Current, Switched-Capacitor Temperature Sensor in 0.6-μm CMOS," *IEEE J. Solid-State Circuits*, vol. 33, No. 7, pp. 1117-1122 (Jul. 1998).

Wei, G.-Y. et al. "A Variable Frequency Parallel I/O Interface with Adaptive Power Supply Regulation," *IEEE J. Solid-State Circ.*, vol. 35, No. 11, pp. 1600-1610 (Nov. 2000).

\* cited by examiner

DLL-BASED TEMPERATURE SENSOR

RELATED APPLICATION

This application claims the benefit of U.S. Provisional Application No. 61/192,685, filed on Sep. 19, 2008, the entire teachings of which are incorporated herein by reference.

BACKGROUND

As more functional blocks, with varying activity rates, are integrated into a microprocessor, large temperature variations appear across the microprocessor's substrate. This temperature variation can adversely affect the microprocessor's performance and reliability. To counter this non-ideality, people have introduced a scheme where they first measure the spatial thermal profile of a microprocessor and subsequently adjust a local power dissipation adapted to the measured local temperature. The spatial thermal profiling of a microprocessor may be executed by building integrated temperature sensors, often termed smart temperature sensors, into various locations within the chip.

There exist two types of smart temperature sensors. The first type, which represents a well-established, and very successful paradigm for smart temperature sensors, utilizes the temperature dependence of bandgap voltages of bipolar transistors. For example, the proportional-to-absolute-temperature (PTAT) bandgap voltage of bipolar transistors is measured using an analog-to-digital converter (ADC) to generate a digital temperature output as shown in FIG. 1A. In standard CMOS processes, parasitic pnp junctions involving the substrate are utilized to form bipolar transistors.

The second type of smart temperature sensors, which have appeared more recently and have significant possibilities for further development, are based on CMOS transistors. Exploiting the fact that the time delay of a CMOS inverter varies with temperature, the CMOS smart temperature sensors measure delays in open-loop inverter chains as shown in FIG. 1B, or similarly, frequencies of ring oscillators, to extract temperature information. The time delay can be measured using a time-to-digital converter (TDC) to produce a digital temperature output. For microprocessor spatial thermal profiling, these delay-based CMOS smart temperature sensors may potentially be well suited, as, though less accurate, they are all digital and use only standard CMOS transistors without the need for parasitic bipolar transistors.

SUMMARY

Embodiments of the present invention are directed to a delay-based smart temperature sensor which have application in microprocessor thermal profiling.

One feature of embodiments of our delay-based temperature sensor relates to simplicity in calibration. Since the inverter delay varies not only with temperature but also with process variation, a calibration procedure is required to compensate for process variation. To this end, all of the aforementioned delay-based CMOS temperature sensors require two-point calibration schemes, where delays are measured at two different known temperatures to calibrate out process variations, with the aim to attain the same temperature-to-output dependency across all different process corners. In contrast, embodiments of our delay-based smart temperature sensor operate with only one-point calibration. Two-point calibration requires one more temperature control step, and thus, a simpler one-point calibration process is desired. This is especially true for microprocessor applications where temperature sensors play only auxiliary roles and their calibration should cost as little of the entire system test effort as possible. Our one-point calibration approach is enabled by making a key observation that the inverter delay can be separated into a temperature-only-dependent function and a process-only-dependent function. This separation of variables allows calibration for the process dependency in one step.

The inverter delays can be measured and mapped to digital temperature outputs on chip by using a TDC. A second feature of embodiments of our temperature sensor relates to utilization of a delay-locked loop (DLL) as a TDC, among various types of TDC available. Temperature-dependent inverter delays are measured in comparison to a precise, temperature-independent delay reference provided by the DLL. Although the DLL requires an external stable frequency reference like a crystal oscillator, such stable clock sources are readily available in almost all microprocessor applications, and their signals can be easily distributed across the chip without attenuation. A known delay-based CMOS temperature sensor also used a TDC in measuring inverter delays, but their TDC was not based on a DLL, and no stable reference clock was used.

In the conventional bandgap-based temperature sensors, a precise voltage reference in conjunction with an ADC plays a key role in measuring the temperature-dependent bandgap voltage variation. The precise delay reference and the DLL-based TDC in embodiments of our temperature sensor are analogues of the precise voltage reference and the ADC of the bandgap-based temperature sensor, respectively.

Accordingly, a temperature sensor includes an open-loop delay line comprising plural delay cells and a multiplexer configured to select a first number of the plural delay cells; a delay-locked loop comprising plural delay cells and a multiplexer configured to select a second number of the plural delay cells; a stable clock coupled to an input of the open-loop delay line and to an input of the delay-locked loop; a bang-bang type phase detector having a first input coupled to an output of the open-loop delay line and a second input coupled to an output of the delay-locked loop; and a finite state machine configured to detect a transition in the output of the phase detector.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION

Figure 1A:
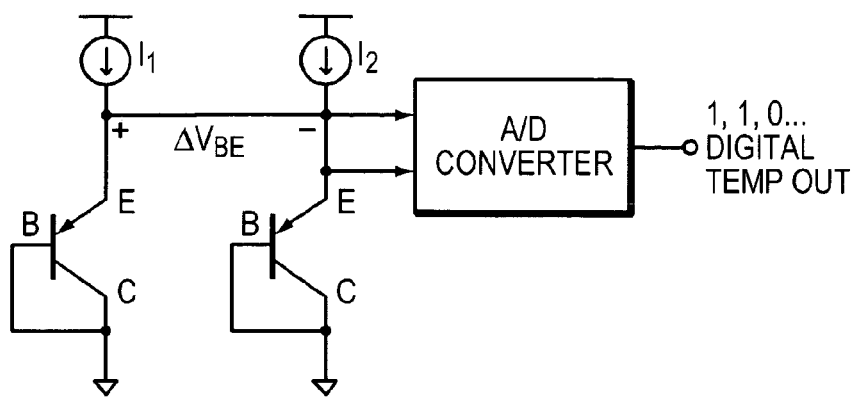
FIG. 1A illustrates a bipolar junction transistor-based smart temperature sensor.
Figure 1B:
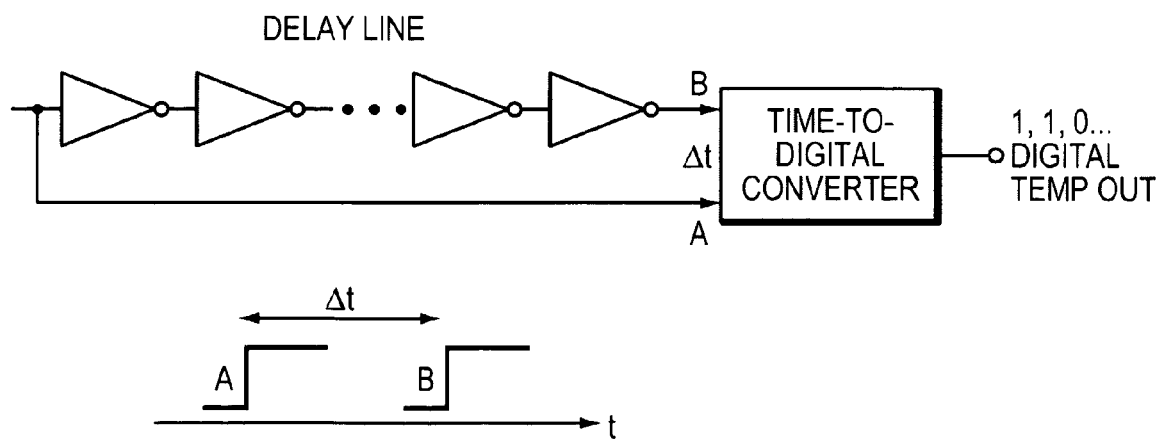
FIG. 1B illustrates a CMOS smart temperature sensor.

A description of the operating principles of our temperature sensor is first presented in the following section.

I. Operating Principle (1): One-Point Calibration

A. Inverter Delay and Separation of Variables

Since the separability of the CMOS inverter delay into a function of only temperature and a function of only process parameters makes possible our one-point calibration, we will first establish this separation of variables. Consider a CMOS inverter with equivalent PMOS and NMOS strengths. The propagation delay, D, through the CMOS inverter may be expressed as:

$$D = \frac{L}{W} \frac{C_L}{C_{ox}} \cdot \frac{1}{\mu} \cdot \frac{\ln\{3 - 4V_{th}/V_{dd}\}}{V_{dd}(1 - V_{th}/V_{dd})} \quad (1)$$

Here $C_L$ is the load capacitance and $V_{dd}$ is the supply voltage. L and W are the gate length and width, respectively, $\mu$ is the mobility, $C_{ox}$ is the gate oxide capacitance per unit area, and $V_{th}$ is the threshold voltage, all for the NMOS transistor. Among the various parameters appearing in the delay expression, the mobility, $\mu$, and the threshold voltage, $V_{th}$, are the only parameters that vary with temperature to the first order. We now take a close look into their temperature dependence.

First, at temperatures higher than 200K, which we are interested in, the temperature dependence of $\mu$ is experimentally fitted to the following formula:

$$\mu(T) = \mu(T_0)\left(\frac{T}{T_0}\right)^\alpha \quad (2)$$

where T is the temperature at which $\mu$ is measured, $T_0$ is a reference temperature rather arbitrarily chosen for the fitting, and $\alpha$ is an experimentally fitted negative exponent. The mobility indicates the degree of scattering in electron transport in the transistor's conduction channel (an increased amount of scattering translates to lower mobility). As temperature increases, the silicon crystal lattice vibrates more strongly, and hence, electron scattering caused by collisions with the thermal lattice vibration is increased. This accounts for the general tendency of a decreasing mobility with increasing temperature seen in (2).

Second, the threshold voltage $V_{th}$ lends itself to derivation from first principles, and it can be expressed in the following form that highlights its temperature dependence:

$$V_{th}(T) = V_{th}(T_0) + \beta(T - T_0) \quad (3)$$

where $\beta$ is a negative parameter on the order of mV/K. As $\beta$ is a small quantity, the variation of $V_{th}$ with temperature is not as significant as the temperature variation of $\mu$. Furthermore, in (1), $V_{th}$ always appears with $V_{dd}$ in the form of $V_{th}/V_{dd}$, and $V_{th}$ is only a fraction of $V_{dd}$. Combining these two facts, we expect that the temperature dependence of $V_{th}$ should not affect the overall temperature dependence of the inverter delay D, as much as the temperature dependence of $\mu$ does. This can be verified using the values of $\alpha$, $\beta$, $V_{th}$, and $T_0$ readily available from published data: the delay variation due to the temperature dependence of $V_{th}$ is only 2% of that due to the temperature dependence of $\mu$ in the region between 0 and 100° C.

Given the foregoing argument, we may neglect the temperature dependence of $V_{th}$ and consider that only $\mu$ accounts for the entire temperature dependence of the inverter delay D to the first order. The delay expression (1) then can be rewritten to:

$$D(T, P) = \left(\frac{T_0}{T}\right)^\alpha \cdot G(P) \quad (4)$$

where G(P) is defined as $$G(P) \equiv \frac{L}{W} \frac{C_L}{C_{ox}} \cdot \frac{1}{\mu(T_0)} \cdot \frac{\ln\{3 - 4V_{th}/V_{dd}\}}{V_{dd}(1 - V_{th}/V_{dd})} \quad (5)$$

and P collectively denotes various types of process variations. Expression (4) emphasizes that the inverter delay can be separated into the temperature-dependent function $(T_0/T)^\alpha$ and the temperature-independent function G(P), where the latter varies with process variation.

We now argue that the temperature-dependent function $(T_0/T)^\alpha$ originating from the mobility (2) assumes a negligible dependence on process variation. Electron scattering that determines the mobility occurs through electrons' collisions with thermal lattice vibrations and impurity sites. In $(T_0/T)^\alpha$, the general temperature dependency is due largely to the scattering caused by the lattice vibrations, as mentioned earlier. On the other hand, the exponent is due to the scattering caused by the impurity sites, which increase with doping density. For example, changes from −2.2 to −1.5 as the doping density increases by orders of magnitude from $10^{14}/cm^3$ to $10^{17}/cm^3$. An important notion is that the variation of $\alpha$, due to the variation in the doping density, is minimal unless the doping level changes by orders of magnitude: a moderate doping level variation (say, 50%, to be conservative) expected from process variation would hardly alter. Overall, in a given technology with a reasonable degree of process variation, it is safe to assume that $(T_0/T)^\alpha$ in (4) exhibits a negligible dependence on process variation.

In this connection, we can rewrite (4) into $$D(T,P) = F(T) \cdot G(P) \quad (6)$$

where $$F(T) \equiv \left(\frac{T_0}{T}\right)^\alpha \quad (7)$$

Expression (6) highlights the separability of the CMOS inverter delay into the temperature-only-dependent function F(T) and the process-only-dependent function G(P). Separation of variables has been obtained.

B. The Principle of One-Point Calibration

During the inverter delay measurement, the effect of process variation should be calibrated out so the delay can faithfully represent the temperature effect only. The separation of variables of the inverter delay allows for such calibration in just one step (one-point calibration). We first set the temperature at $T=T_c$ (the subscript 'c' denotes 'calibration') and measure the delay $D(T_c, P)$ for a given inverter. This delay is expressed as $$D(T_c,P)=F(T_c) \cdot G(P) \tag{8}$$

We subsequently measure the inverter delay at temperature T, yielding D(T,P) of (6). By dividing D(T, P) by $D(T_c, P)$, we obtain the normalized delay at T:

$$D_{norm}(T) \equiv \frac{D(T,P)}{D(T_c,P)} = \frac{F(T) \cdot G(P)}{F(T_c) \cdot G(P)} = \left(\frac{T_c}{T}\right)^\alpha \tag{9}$$

From (9), we note that the process dependency, G(P), has been canceled out, and the normalized propagation delay $D_{norm}(T)$ becomes a function of temperature only, despite the presence of process variations. Therefore, this normalized delay should be reproducible across different process corners, serving as a faithful temperature representation. This is the foundation of our one-point calibration approach.

Figure 2A:
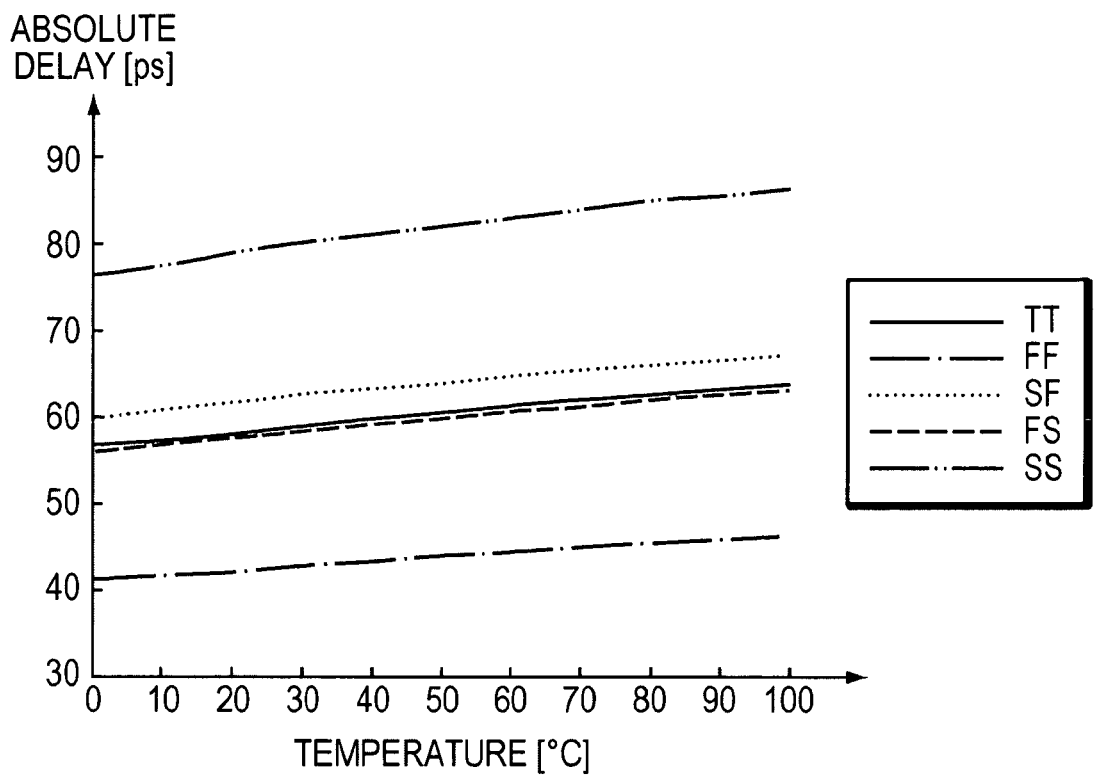
FIG. 2A illustrates absolute inverter delays in different process corners.
Figure 2B:
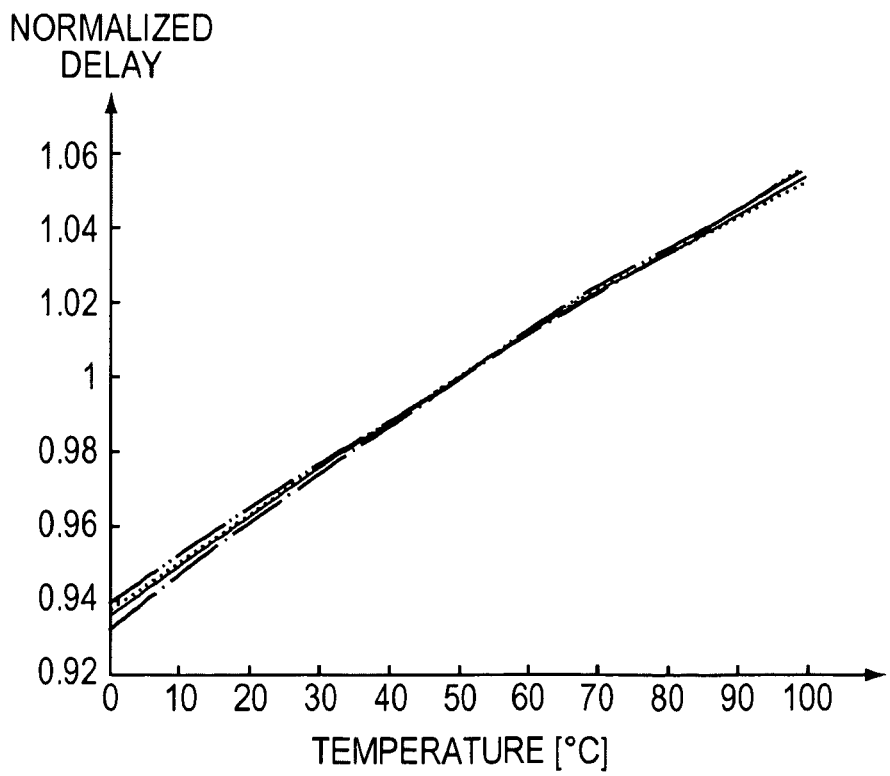
FIG. 2B illustrates normalized inverter delays in different process corners.

To verify the approach, we simulated the propagation delay of an inverter-based buffer that drives a fan-out-two load, in different process corners using Hspice. For this simulation, inverters are minimum sized, and the BSIM3v3.2 active device models from a digital 0.13 μm CMOS technology are used. FIG. 2A shows simulated, absolute propagation delay given by (6) while FIG. 2B shows simulated, normalized delay given by (9) where $T_c=50°$ C. As seen clearly, although the inverters in the slow process corner have approximately twice the absolute delay of the inverters in the fast process corner (FIG. 2A), the normalized delay remains almost the same across all process corners (FIG. 2B). This simulation confirms the validity of the one-point calibration strategy we established.

II. Operation Principle (2): DLL-Based Delay Measurement

Implementation of the approach of the foregoing section involves measuring the delay of a CMOS inverter, or more practically, an open-loop delay line (cascaded CMOS inverters) at a fixed temperature $T_c$, and subsequently measuring the delay of the open-loop delay line at a normal environment temperature T, which is the unknown quantity we want to find out. Dividing the latter delay by the delay at $T_c$ yields the normalized delay that is dependent on T but not on the process variation. Execution of this protocol entails measurements of the time delays, for which we can use a time-to-digital converter (TDC).

Among a variety of TDC types available, we choose to use a delay-locked loop (DLL), to measure the time delays of the open-loop delay line and to produce corresponding digital outputs. The DLL is well suited for our application, as it provides an accurate delay reference, in comparison to which the time delays of the open-loop delay line can be measured. The DLL may be locked to an external stable clock signal (e.g., crystal oscillator). Such stable clock sources are readily available in nearly all microprocessor applications, and their signals can be easily distributed across the chip with negligible attenuation.

In the conventional smart temperature sensors where the temperature dependence of the bandgap voltages of bipolar transistors is utilized (FIG. 1(a)), an accurate voltage reference plays an important role in measuring the bandgap voltage variation in connection with an ADC. The accurate delay reference and the DLL-based TDC in embodiments of our temperature sensor may be understood as analogues of the accurate voltage reference and the ADC of the bandgap-based temperature sensor.

Figure 3:
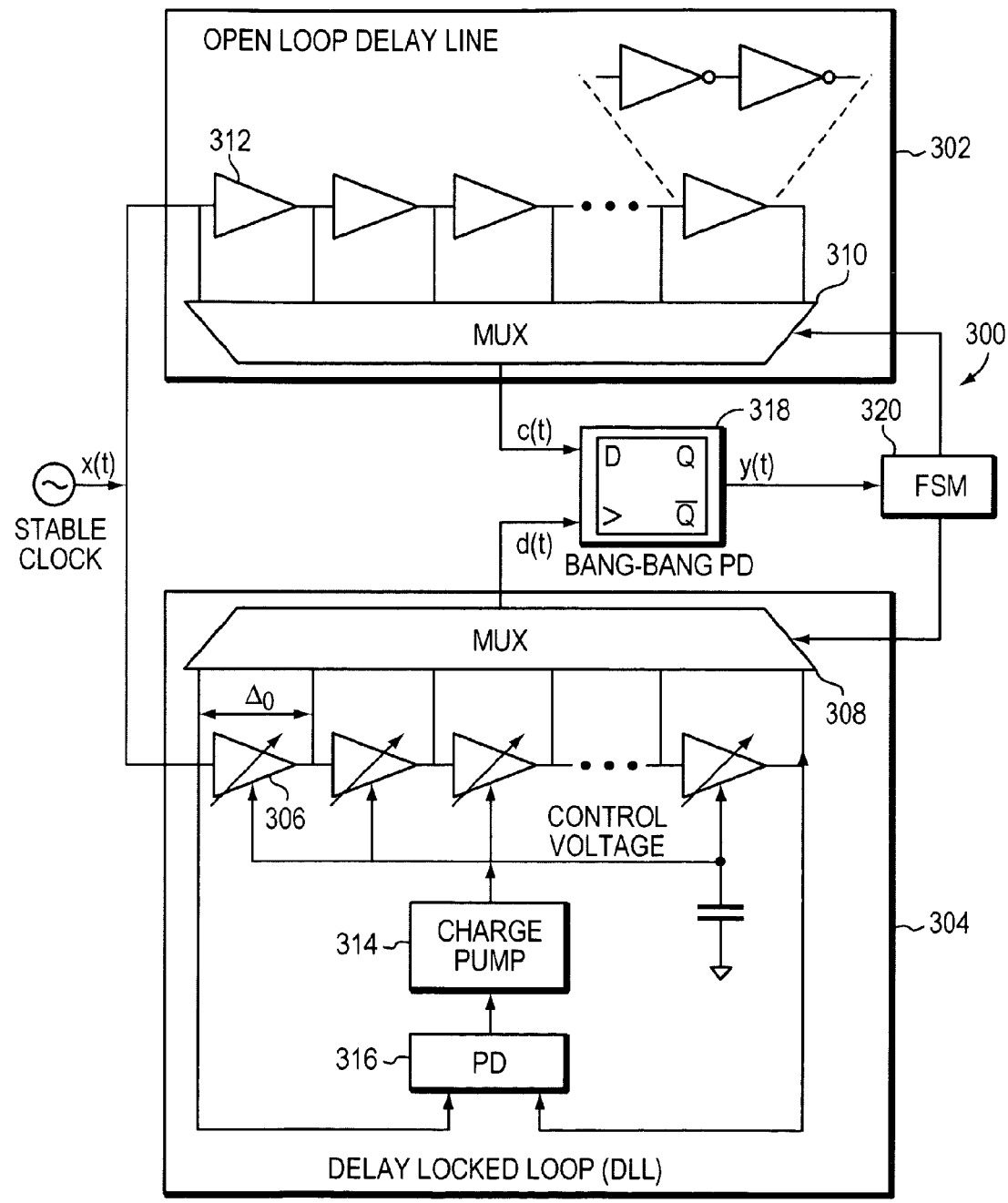
FIG. 3 illustrates a first embodiment of a DLL-based digital temperature sensor.

A first embodiment of our delay-based temperature sensor 300 utilizing a DLL is shown in FIG. 3. It consists of two major components: an open-loop delay line 302 whose delay varies with temperature and process variations, and a DLL 304 whose delay is independent of temperature and process variations. The open-loop delay line 302 includes a multiplexer 310 and delay cells 312. The DLL 304 includes delay cells 306, multiplexer 308, charge pump 314 and phase detector 316.

The DLL is locked to a stable clock x(t) (e.g., crystal oscillator), and thus, the time delay of each DLL delay cell, $\Delta_0$, remains constant despite temperature and process variations. If the number of DLL delay cells 306 used (this number can be chosen at will by using an associated multiplexer 308 shown in FIG. 3) is $N_{DLL}$, the delay between the input x(t) and output d(t) of the DLL is a constant value given by $$D_{DLL}=N_{DLL} \cdot \Delta_0 \tag{10}$$

This total delay through the DLL is independent of temperature and process variation. For the open-loop delay line, if the number of delay cells used is $N_{OL}$ (this number can also be chosen at will using an associated multiplexer shown in FIG. 3), the delay between the input x(t) and output c(t) of the open-loop delay line, at an arbitrary temperature T, is given by $$D_{OL}(T,P)=F(T) \cdot N_{OL} \cdot G(P) \tag{11}$$

This delay through the open-loop delay line varies with both temperature and process variations. Now we explain how with this circuit arrangement we can measure the temperature with one-point calibration.

A. Calibration Mode

Figure 4A:
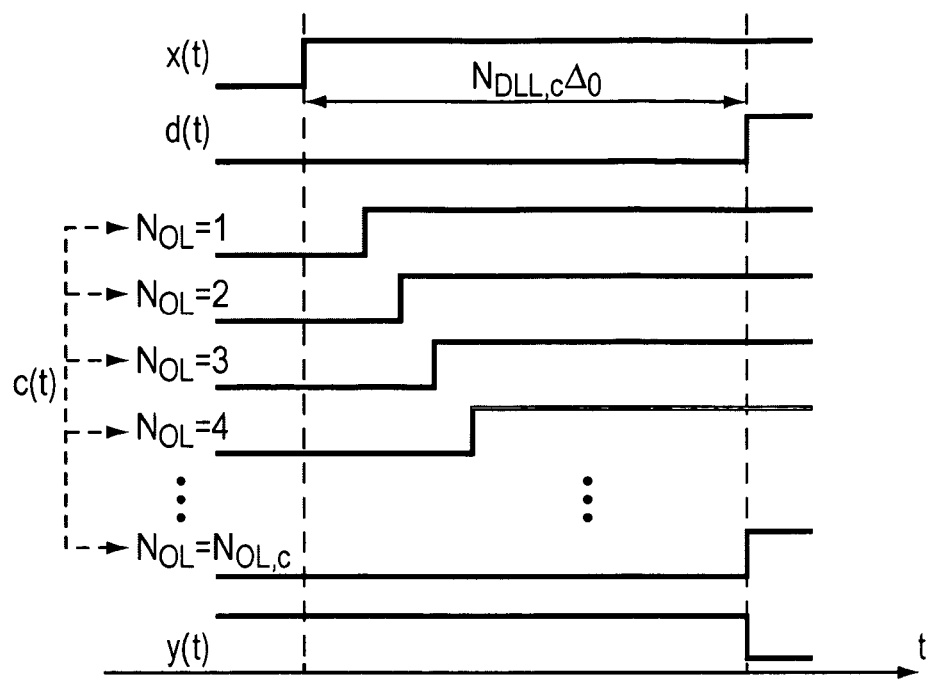
FIG. 4A illustrates a calibration mode of the embodiment of FIG. 3.

In calibration mode, the temperature and the number of DLL delay cells are fixed at certain values, $T_c$ and $N_{DLL,c}$. Subsequently, the number of delay cells $N_{OL}$ in the open-loop delay line is increased using the multiplexer 310 until the total delay through the open-loop delay line, $D_{OL}$, becomes equal to the total delay through the DLL, $D_{DLL}$ (FIG. 4A). Let us denote the number of delay cells 312 in the open-loop delay line as $N_{OL,c}$ when $D_{OL}=D_{DLL}$ occurs. Then we have the following calibration equation:

$$F(T_c) \cdot N_{OL,c} \cdot G(P)=N_{DLL,c} \cdot \Delta_0 \tag{12}$$

Since the right hand side of (12) and $F(T_c)$ are all constants, $N_{OL,c}$ G(P) is constant across all process corners. For example, if G(P) is smaller, $N_{OL,c}$ is made larger, while if G(P) is larger, $N_{OL,c}$ is made smaller. It is the constant product $N_{OL,c}$ G(P) obtained in this calibration stage that is used later in the measurement mode to compensate for process variations.

On the circuit side, in order to detect $N_{OL}=N_{OL,c}$ for which $D_{OL}=D_{DLL}$, we can use a bang-bang phase detector (PD) 318 as shown in FIG. 3 to compare the rising edge of the DLL output d(t) to that of the open-loop delay line output c(t). In the beginning, when $N_{OL}$ is small, the rising edge of c(t) leads that of d(t). However, as $N_{OL}$ is increased, the former approaches the latter, as shown in FIG. 4A. When the rising edge of c(t) eventually lags the rising edge of d(t) for the first time with $N_{OL}=N_{OL,c}$, the phase detector output y(t) changes from one to zero. A finite state machine (FSM) 320 detects this transition and stores $N_{OL,c}$ for later use in measurement mode.

B. Measurement Mode

Figure 4B:
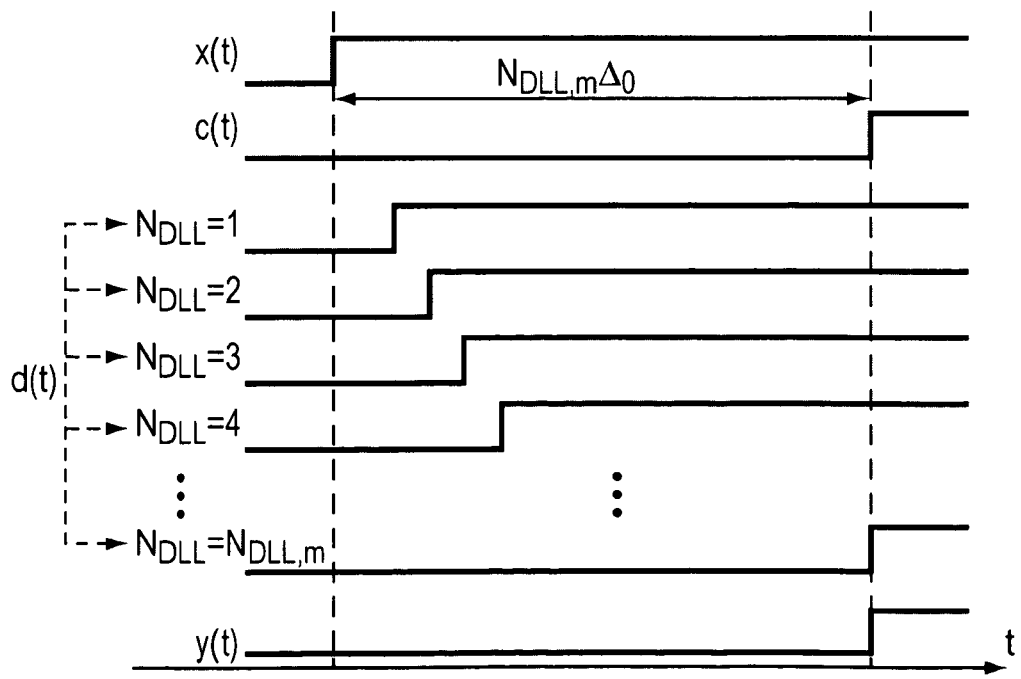
FIG. 4B illustrates a measurement mode of the embodiment of FIG. 3.

Once the one-point calibration at $T_c$ is complete, the temperature sensor can be used to measure its environment temperature T. In contrast to the calibration stage where $N_{DLL}$ was fixed and $N_{OL}$ was varied, in the measurement stage, $N_{OL}$ is fixed at $N_{OL,c}$ obtained at the end of the calibration stage, and $N_{DLL}$ is varied. More specifically, $N_{DLL}$ is increased until $D_{DLL}$ becomes equal to the delay through the open-loop delay line $D_{OL}$ (FIG. 4B). Let us denote the number of DLL delay cells as $N_{DLL,m}$ when $D_{OL}=D_{DLL}$ occurs in the measurement stage (the subscript 'm' denotes 'measurement'). We then have the following measurement equation:

$$F(T) \cdot N_{LO,c} \cdot G(P) = N_{DLL,m} \cdot \Delta_0 \quad (13)$$

Since the product $N_{LO,c} \cdot G(P)$ was determined in the calibration stage by (12), we can eliminate this product in (13) in order to understand what $N_{DLL,m}$ means:

$$N_{DLL,m} = \frac{F(T)}{F(T_c)} \cdot N_{DLL,c} \quad (14)$$
$$= \left(\frac{T_c}{T}\right)^\alpha \cdot N_{DLL,c}$$

As can be clearly seen, $N_{DLL,m}$ is a function of temperature only, and the effect of process variation has been removed by the one-point calibration, which fixed the product $N_{OL,c} \cdot G(P)$ at a constant value. Therefore, in our scheme, $N_{DLL,m}$ serves as a digital output that accurately represents the environment temperature T. Note that obtaining (14) is essentially the same procedure as that used in the delay normalization that led to (9). The normalization process, however, is already included (thus automated) in the calibration and measurement operation, and all we need to do is to read out the digital output $N_{DLL,m}$ as a process-independent indicator of temperature.

III. Design & Implementation

Figure 5:
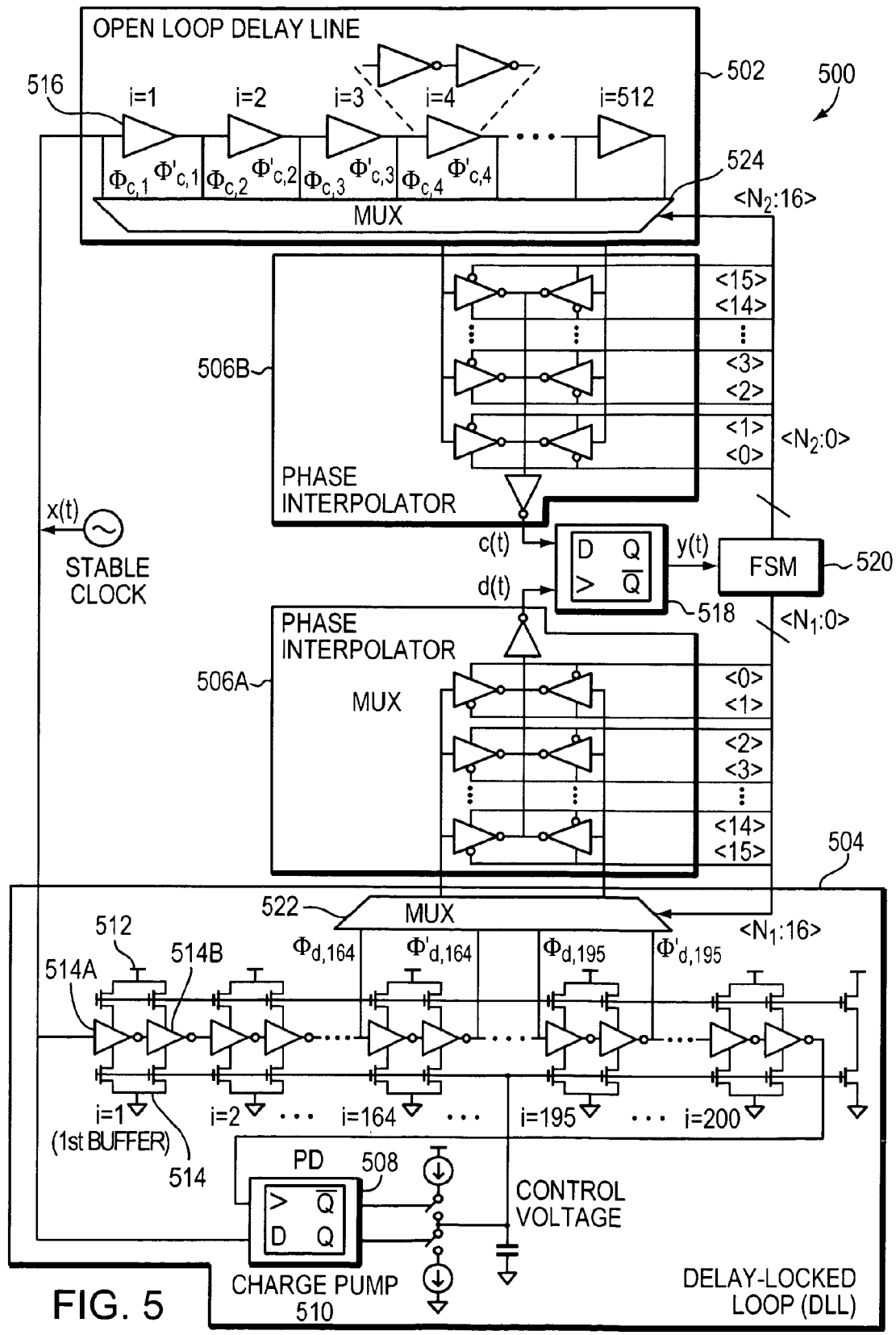
FIG. 5 illustrates a second embodiment of a DLL-based digital temperature sensor.

A second embodiment of our DLL-based digital temperature sensor 500 is shown in FIG. 5. The DLL 504 in the lower portion of the figure is constructed by putting together a bangbang phase detector 508 and a charge-pump 510 in a loop along with a variable delay line 512. Each voltage-controlled buffer 514 in the variable delay line consists of two cascaded current-starved inverters 514A, 514B. The open-loop delay line 502 in the upper portion of the figure is a cascade of an even number of minimum-sized identical delay cells 516. Two inverters constitute a single delay buffer. The DLL is locked to a stable clock x(t), e.g., 30 MHz is a standard crystal oscillator frequency. The open-loop delay line is also driven by x(t). We denote the period of x(t) as $P_0$.

A. Detailed Circuit Arrangement

In FIG. 5, the variable delay line 512 of the DLL and its associated multiplexer 522, along with the newly added phase interpolator 506A (which we did not show in the basic sensor architecture of FIG. 3), are arranged in a rather complex way. More specifically, the variable delay line of the DLL is comprised of a total $D_{TOT}$ voltage-controlled delay buffers, among which $2^B$ buffers are connected to the multiplexer 522, where B is the number of multiplexer control bits. In the example embodiment shown in FIG. 5, $D_{TOT}$ equals 200 buffers, B equals 5 and $2^B$ equals 32 (with particular buffers $164^{th}$ through $195^{th}$ connected). The multiplexer selects an input and an output of a buffer chosen among the 32 buffers as two inputs to the tristate-inverter-based phase interpolator, which generates an additional $2^{P-1}$ phases between its two input phases, where P is the number of control bits on the interpolator. In the embodiment shown in FIG. 5, P equals 3 and $2^{P-1}$ equals 7. This arrangement allows the sensor's measurement range to cover 0 to 100° C., while at the same time obtaining a sub-° C. measurement resolution. We now explain how the arrangement of FIG. 5 achieves both goals.

i.) Temperature Measurement Range

At the beginning of the one-point calibration at temperature $T_c$, among the 32 buffers in the DLL's delay line whose buffer index is i=164, 165, . . . , 195, the multiplexer 522 selects the $i_c$-th buffer (specific choice of $i_c$ is variable) to fix the delay of the DLL, $D_{DLL}$ (delay between x(t) and d(t)). We assume that there is no phase interpolator (the interpolator is to acquire the target temperature resolution, which we will discuss shortly). Since the delay through the entire 200 buffers in the DLL's delay line is exactly $P_0$, $D_{DLL}=P_0 \cdot i_c/200$, at the end of the one-point calibration, the delay of the open-loop delay line, $D_{OL}$ (delay between x(t) and c(t)), is made equal to $D_{DLL}$, that is, $D_{OL}=P_0 \cdot i_c/200$.

In the measurement mode at temperature T, $D_{OL}$ will deviate from $P_0 \cdot i_c/200$ due to the temperature deviation from $T_c$. Our simulation (FIG. 2A) indicates that the delay of any single identical buffer of the open-loop delay line varies by approximately 10% as the temperature changes from 0 to 100° C., thus, for the same temperature change, $D_{OL}$ should vary by 10%, that is, the delay variation $\Delta D_{OL}$ corresponding to the 100° C. temperature change is $P_0 \cdot i_c/2000$. The maximum $\Delta D_{OL}$ is denoted as $D_{MAXOL}$ and in the embodiment shown is 3.22 ns when $i_c=195$. This temperature-dependent delay variation of the open-loop delay line is measured by using the DLL. Since 32 buffers in the DLL delay line are connected to the multiplexer 522, the maximum attainable delay change of the DLL, denoted as $D_{MAXDLL}$, is $P_0 \cdot 32/200 = 5.28$ ns. This value is larger than the maximal delay variation of the open-loop line (3.22 ns), thus, our sensor can cover the entire target measurement range of 0 to 100° C.

ii.) Temperature Measurement Resolution

To attain a sub-° C. temperature measurement resolution, we set out to measure the maximum delay variation 3.22 ns of the open-loop delay line (for the 100° C. temperature change) with a 7-bit resolution. To this end, the delay of the DLL, $D_{DLL}$, should be able to be varied with the delay step of $3.22$ ns/$2^7=25$ ps. However, the minimum achievable delay by a single buffer is only about 100 ps according to simulation results. Therefore, we need to improve the time resolution of the DLL. The phase interpolator achieves the required fine time resolution. If we denote the input and output phases of the i-th buffer (i=164, 165, . . . , 195) of the DLL's delay line as $\Phi_{d,i}$ and $\Phi'_{d,i}$, then the interpolated phase $\Phi_d$ at the output of the phase interpolator is given by $\Phi_d=(1/8)[(8-k) \cdot \Phi_{d,i}+k \cdot \Phi'_{d,i}]$ (k=0, 1, 2 . . . 8). In other words, the phase interpolator 506A generates an additional 7 phases between its two input phases. Owed to this interpolator, the time resolution of the DLL, which is given by $P_0/200/8$, becomes 20 ps, with which we can attain the 7-bit resolution. During the measurement mode where the DLL delay line's buffer index i runs up to 32 codes and the phase interpolator control index k runs up to 8 codes, the maximum number of index changing steps till the temperature is measured is 32×8=256.

The open-loop delay line has a simpler arrangement. There are a total of 512 buffers 516 constituting the entire delay line, and all the buffers are connected to the multiplexer 524. The multiplexer output is connected to another phase interpolator 506B that introduces 7 additional phases for the finer time resolution. The maximum number of buffer and phase interpolator index changing steps to attain a calibration is 512×8=4096.

B. Calibration & Measurement Algorithm

Figure 6:
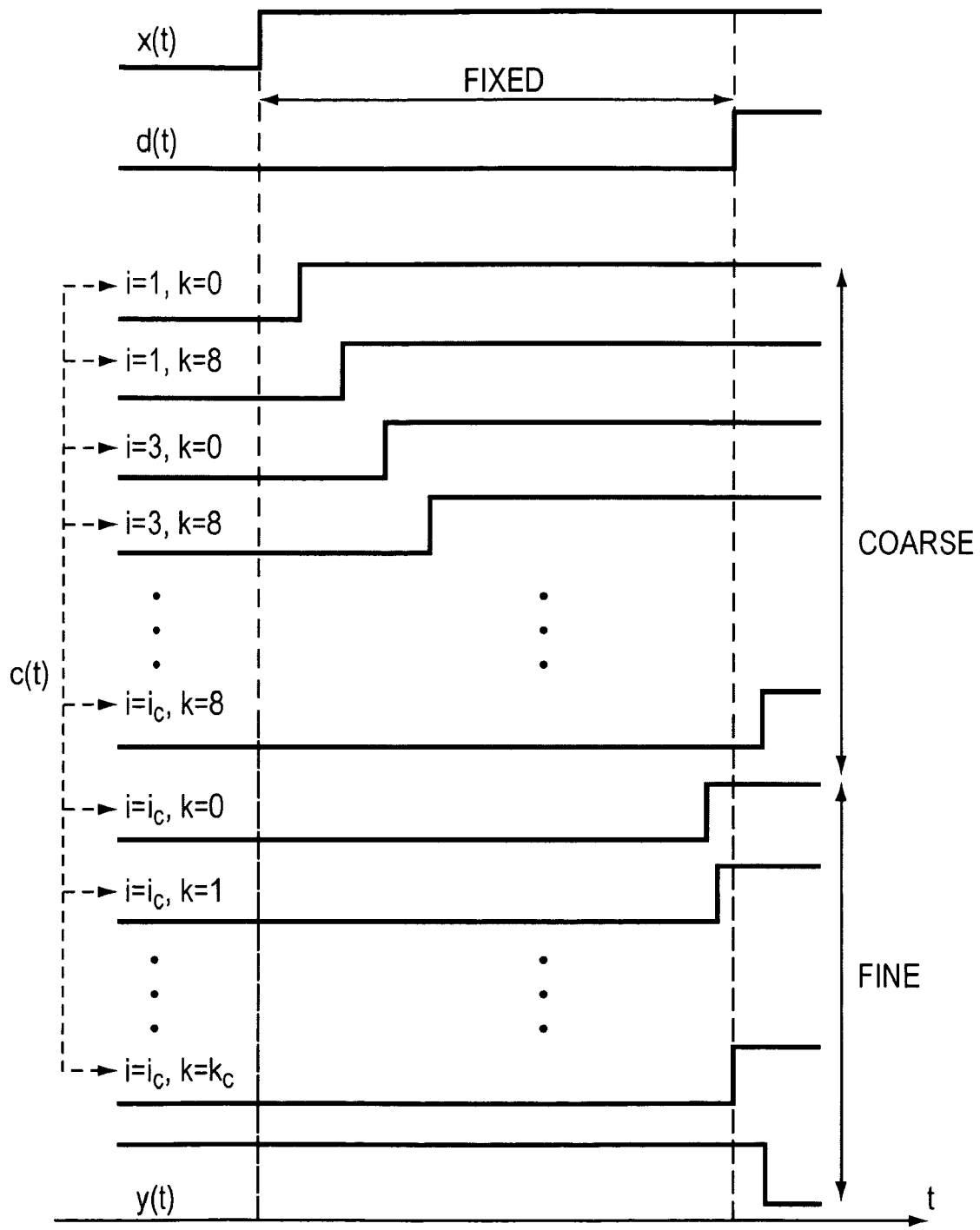
FIG. 6 illustrates a calibration mode of the embodiment of FIG. 5.

Due to the use of the phase interpolators, the detailed algorithm for the one-point calibration and temperature measurement are altered from those explained above, although the principle remains the same. The basic idea of the algorithm is to perform a coarse search first by tuning the buffer index i, followed by a fine search by tuning the phase interpolator index k. Here, the varied buffer and interpolator indices are from the open-loop delay line in the case of calibration, and from the DLL in the case of measurement. We explain this algorithm in detail, using an example of calibration, with reference to FIGS. 5 and 6.

At the start of the one-point calibration, the DLL delay $D_{DLL}$ is set constant by fixing the buffer index i in the DLL (by the multiplexer) and fixing the phase interpolator index k. For the open-loop delay line, there are a total of $2^{CN}$ buffers, where CN equals 9 in the embodiment shown (each buffer indexed as i=1, 2, 3, . . . , 512), and we have to identify the correct buffer index i and interpolator index k for the open-loop delay line that makes the delay of the open-loop delay line equal to the fixed delay of the DLL. We first find i (coarse search), then find k (fine search).

In the beginning of the coarse search, i is set to 1 (1st buffer is chosen by the multiplexer), and the input and output phases $\Phi_{c,1}$ and $\Phi'_{c,1}$ of the 1st buffer are selected as inputs to the phase interpolator, and the interpolator selects $\Phi_{c,1}$ (k=0) as its output. If the finite state machine (FSM) 520 does not detect the one-to-zero phase detector (PD) transition (if the rising edge of c(t) is still leading the rising edge of d(t)), the interpolator selects $\Phi'_{c,1}$ (k=8) as its output. If the FSM still does not detect the one-to-zero PD transition, we move on to the 3$^{rd}$ buffer, setting i=3 (we will shortly explain why we skip even numbers), then repeat the same procedure as above. This procedure is repeated until the FSM detects the one-to-zero PD transition, fixing i to its final number $i_c$. The $i_c$-th buffer has been chosen for the open-loop delay line. Now with this fixed buffer, we change k for the fine search, increasing it from 0 to 8 until the FSM detects once again the one-to-zero PD transition at k=$k_c$. We have found i=$i_c$ and k=$k_c$, and the delay through the open-loop delay line has been made equal to the delay through the DLL within the resolution of the temperature sensor. In the algorithm above, we skipped even numbered buffers, because our fine search algorithm for a fixed odd $i_c$ actually looks for k not only with $i_c$ but also with $i_c-1$, which is an even numbered buffer. Therefore, at the very end of the fine search, $i_c$ can be either even or odd.

The measurement mode works exactly the same way. At the end of a measurement, final $i_c$ and $k_c$ for the DLL delay line will result. In the preceding description where we did not have the phase interpolator, the delay of the DLL was given by $N_{DLL}\Delta_0$ where $N_{DLL}$ is the number of buffers used and $\Delta_0$ is the constant delay through a single buffer in the DLL. In the presence of the phase interpolator, the delay of the DLL is given by $N_{DLL}\Delta_0/8$ where $N_{DLL}$ takes into account not only the number of buffers used but also the finer phase differences introduced by the phase interpolator ($\Delta_0$ is still the same constant delay through a single buffer in the DLL). One can show that $N_{DLL}$ in such a scenario is given by $$N_{DLL} = \begin{cases} 8(i_c - 1) + k_c & \text{[for } i_c\text{: odd]} \\ 8i_c - k_c & \text{[for } i_c\text{: even]} \end{cases} \quad (15)$$

This $N_{DLL}$ is used as a digital temperature output in our measurement results.

IV. Experiments

Figure 7:
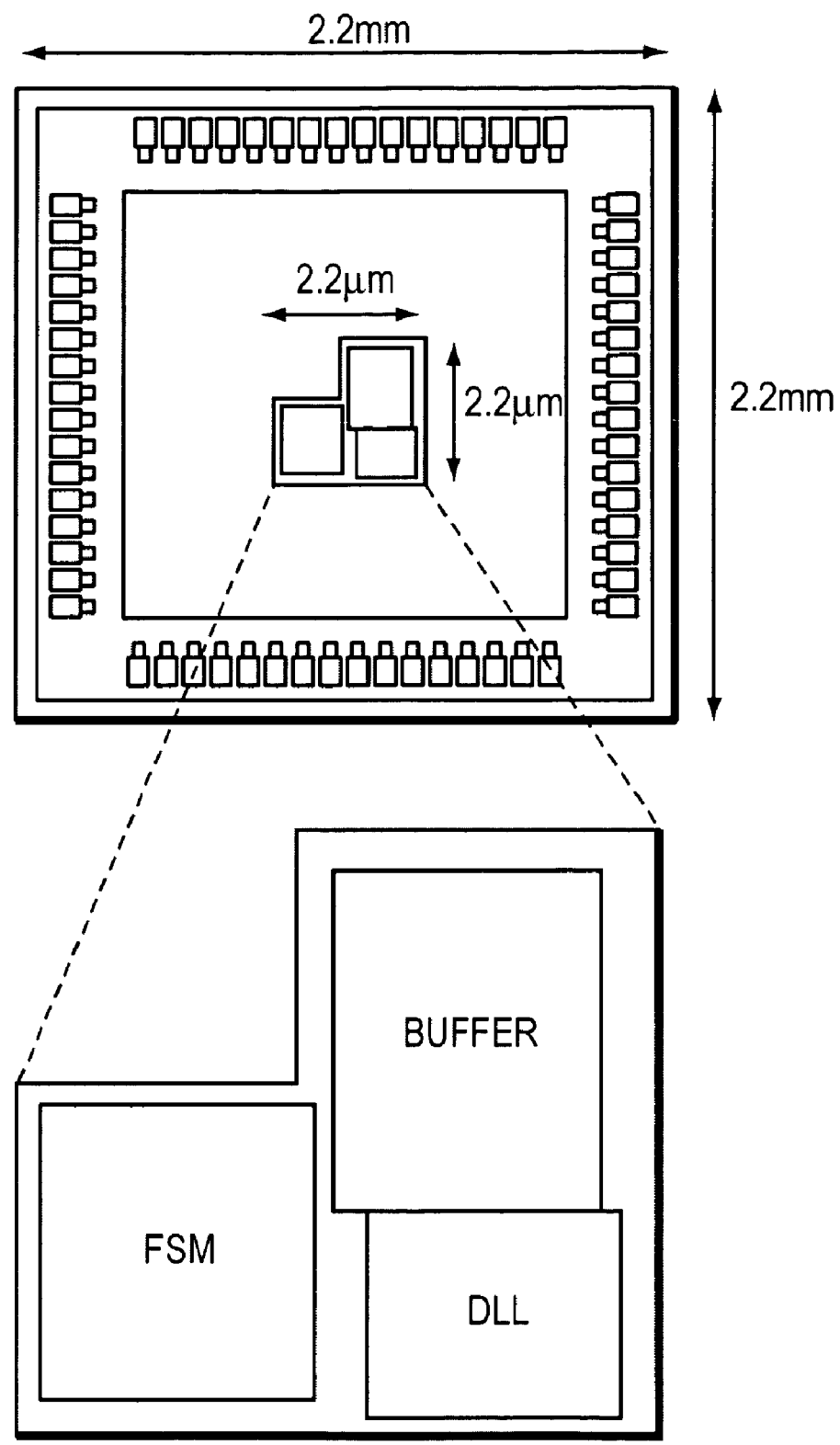
FIG. 7 illustrates a die micrograph for an example DLL-based CMOS digital temperature sensor.

A proof-of-concept DLL-based CMOS all-digital temperature sensor was designed and fabricated in 0.13 μm digital CMOS technology. FIG. 7 shows the die micrograph. Due to the metal fill required by the technology, the internal circuit structure cannot be seen from the micrograph. Therefore in FIG. 7, we overlapped the actual physical layout of our circuit on the exact die portion the circuit occupies. Although the entire die area is 2.2 mm by 2.2 mm, the chip is pad limited. The core area of the temperature sensor circuit occupies an area of 0.12 mm$^2$.

The die was packaged in a 9-mm MLF 64-pin package, and the package was inserted into a Plastronics 64-pin MLF socket. The socket was mounted on a printed circuit board that contains auxiliary electronics. A 1.2 V power supply was used.

A 30 MHz stable clock signal (x(t) in FIG. 5) is produced by an Agilent 33250A function generator. A National Instrument sensor PCIe-6536 digital I/O card is used to activate our temperature sensor and read out the digital output. Within this setup, five different chips, which represent process variation, were tested.

A. Calibration and Temperature Measurement

Figure 8A:
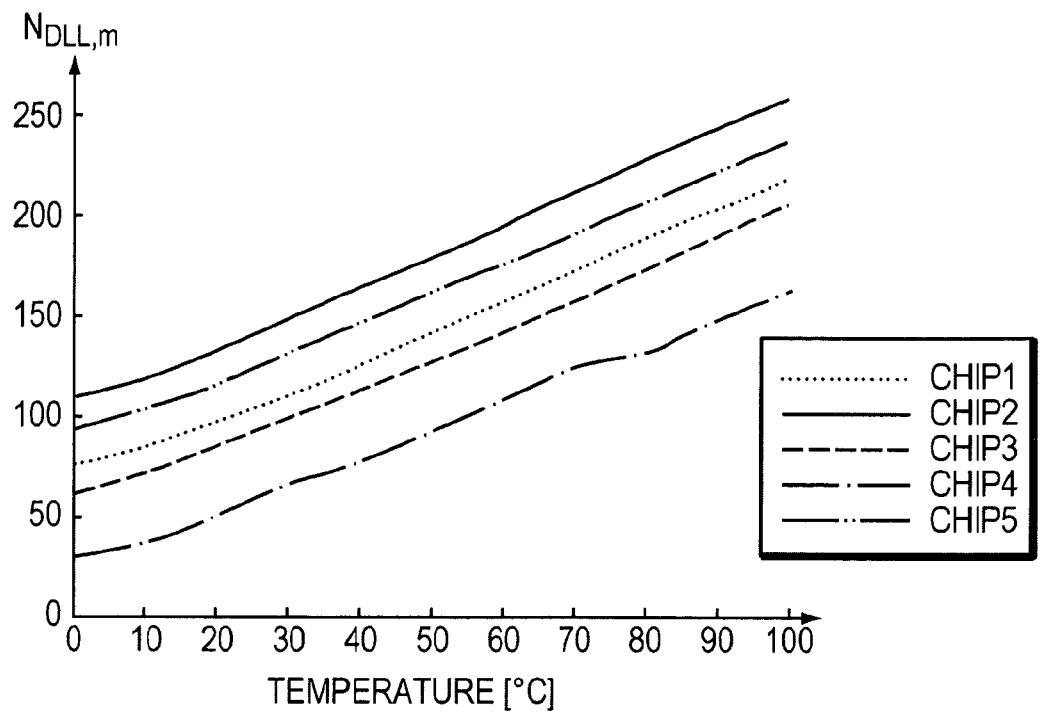
FIG. 8A illustrates measurement results obtained for five different chips fabricated from the die shown in FIG. 7 with one-point calibration for only one selected chip.

In the first set of measurements, one chip was selected and one-point calibration was performed at $T_c$=50° C. with a fixed DLL delay index [see (15)] of $N_{DLL,c}$=140 (i=18, k=4). After the one-point calibration with only this specific chip, $N_{OL,c}$ results. $N_{OL}$ in the open-loop delay line in each of the five chips was fixed at this same $N_{OL,c}$. In other words, only the specifically selected chip was calibrated, while the remaining four chips were not calibrated according to their own process variations. FIG. 8A shows the measured DLL delay index $N_{DLL,m}$ with varying temperature in the measurement mode. An Envirotronics EnviroFLX500 temperature and humidity chamber was used for the temperature control. As can be seen in FIG. 8A, due to the lack of calibration of the remaining four chips, the temperature-output dependence is not consistent amongst the different chips.

Figure 8B:
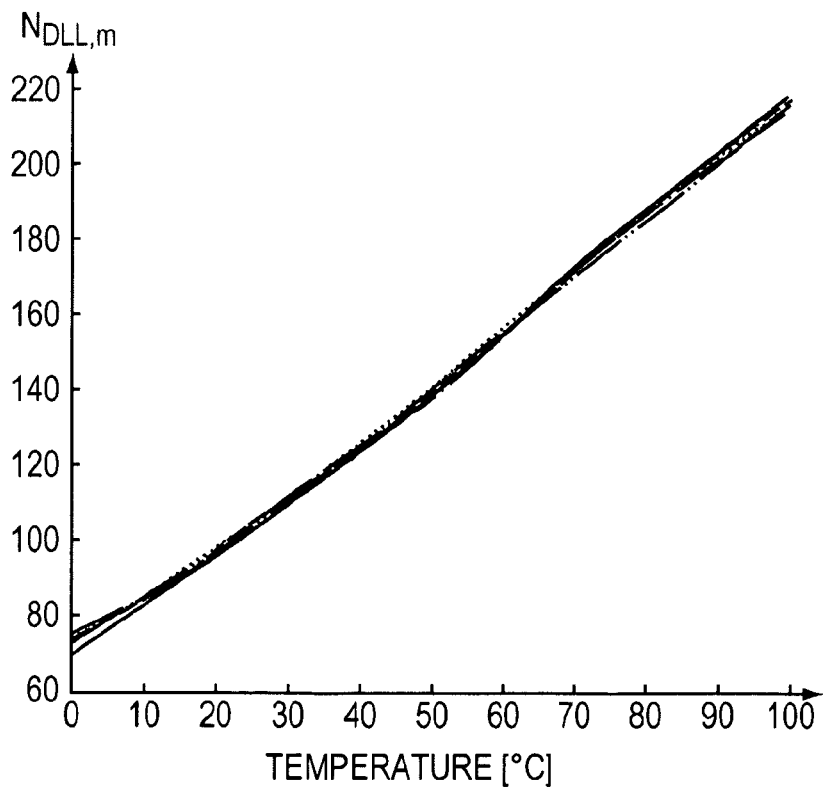
FIG. 8B illustrates measurement results obtained for five different chips fabricated from the die shown in FIG. 7 after proper one-point calibration for each chip.
Figure 9:
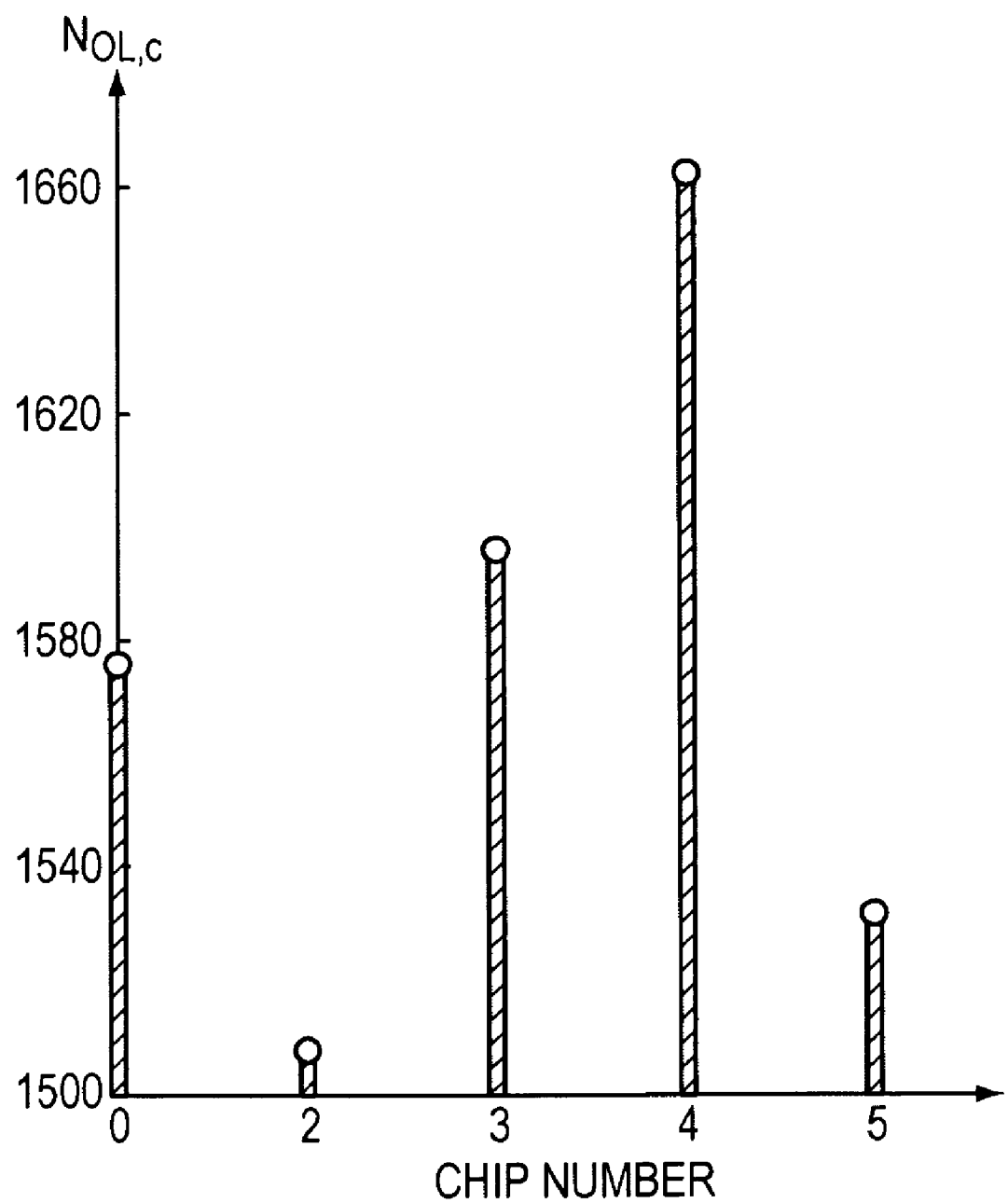
FIG. 9 is a chart illustrating the number of delay cells in an open-loop delay line for a calibration mode for five different chips fabricated from the die shown in FIG. 7.
Figure 10:
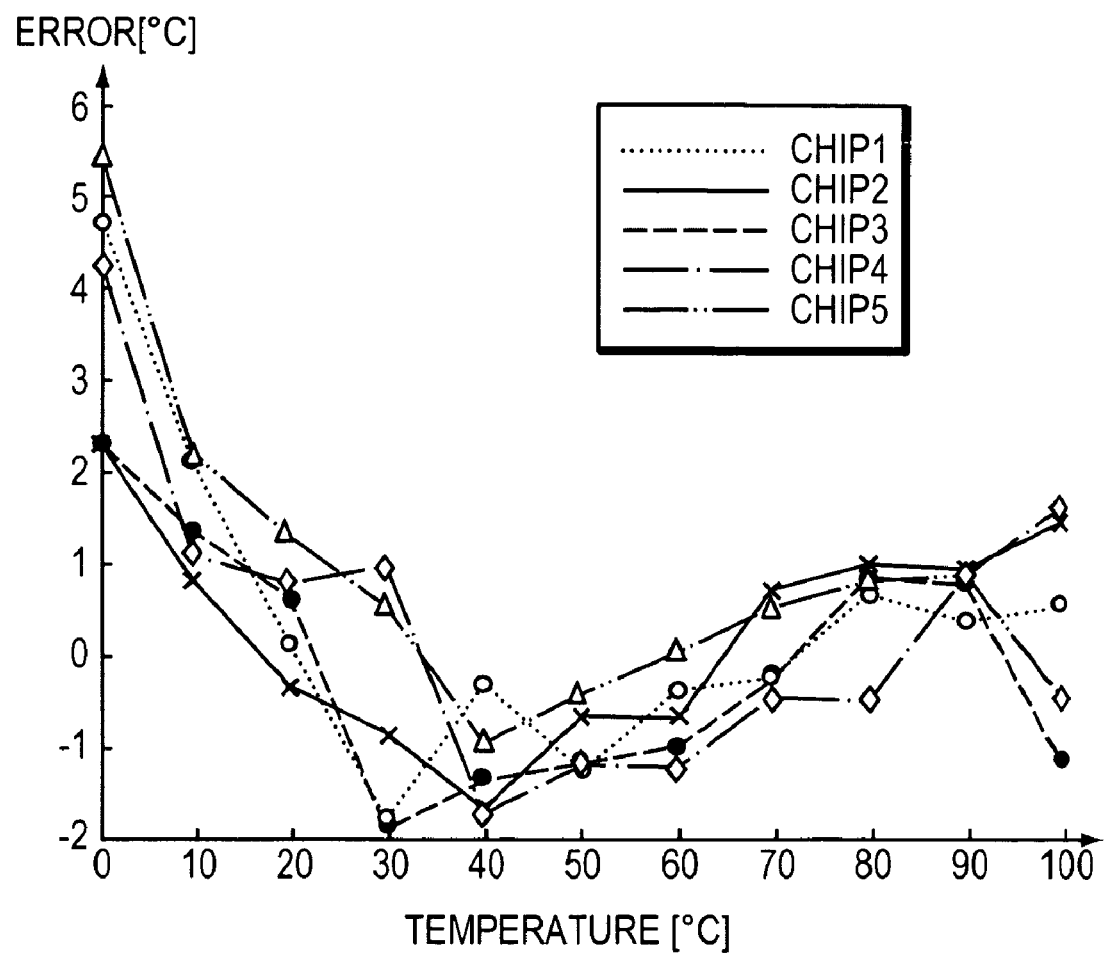
FIG. 10 is a chart that illustrates temperature measurement error for five different chips from the die shown in FIG. 7.

In the second set of measurements, the one-point calibration was performed for each of the five chips. FIG. 9 shows $N_{OL,c}$ for each of the five chips after the calibration. It clearly shows the process variations among the different chips, and adaptive choices of $N_{OL,c}$. After the one-point calibration for each chip, $N_{DLL,m}$ versus temperature was measured for each chip, with the results shown in FIG. 8B. As can be seen, the temperature dependence of the digital output is consistent across different chips, despite process variation, attesting to the validity of our approach. FIG. 10 shows the corresponding temperature measurement error. These errors were measured with respect to a linearly fitted line without any curvature correction. In the temperature range from 20 to 100° C., the measured error falls within −2.0~1.5° C. Below 10° C., the temperature error is larger, and an error as large as 5° C. appeared at 0° C. Such an error would not be tolerable in various high-precision applications, and an improvement needs to be made in general. For the microprocessor application, however, the error at the lower temperature may be tolerable, as the use of the power control system is generally concerned with the higher temperature regime. From the linearly fitted line, the index α appearing in (2) was also extracted: α≈−0.4. The temperature measurement resolution obtained from the same linearly fitted line is 0.66° C. per LSB for 7-bit digital outputs.

B. Causes of Errors

Since this error is in close range of the error described herein, most of the error probably comes from the one-point calibration. In addition to that the circuit nonlinearity, especially in the DLL delay cell, can also affect the error. As temperature goes down, the control voltage of the delay cell will go down to compensate the temperature. Therefore in the lower temperature region, the current-starved inverter will work high VCDL gain region, and may bring more fluctuation of the delay in the delay cell and nonlinearity of the delay cell may increase. This circuit nonlinearity may affect the linearity of the measurement results and hence can be another measurement error source.

From these results, the measurement error after this normalization falls within −3.0~3° C. in the temperature range from 20 to 100° C. and measurement error as large as −5° C. appeared at 0°. Though this accuracy is not as good as in the previous examples which used two-point calibration (within ±1° C.), this accuracy may be enough in the microprocessor applications since it does not require very high accuracy and one-point calibration simplifies total testing steps.

C. Data Averaging

Jitters in the DLL cause fluctuations in the DLL delay, and the power supply noise causes fluctuations in the delay of the open-loop delay line. As a result, $N_{OL,c}$ or $N_{DLL,m}$ measured in a signal measurement exhibits fluctuations. Since the target delay resolution of our DLL-based temperature sensor is a relatively small value of 20 ps, it may be beneficial that the fluctuations in the digital data outputs are averaged out.

In our measurements presented in the foregoing sections, each of the digital outputs $N_{OL,c}$ and $N_{DLL,m}$ is a number averaged over $N_{AVG}$ separately obtained measurements. In one example, $N_{AVG}$ equal to 100 digital output data points for a given temperature were sampled at a rate of 500,000 samples per second, and these 100 samples were averaged using an external computer (interfaced through the PCI card) to obtain an averaged digital output (the effective sampling rate thus is 5000 samples per second). Including this signal averaging, the time required for the one-point calibration was approximately 0.5 ms. The power consumption of our chip in obtaining the averaged digital outputs was 1.2 mW at the effective sampling rate of 5000 samples per second.

In a microprocessor thermal profiling application, it may be helpful for the power consumed for data averaging on chip to be taken into account in evaluating the entire power cost of the temperature sensor. The on-chip averaging can be done using a digital filter with a bandwidth of 500 kHz (sample rate for each datum), and we expect the power consumption associated with the data averaging to be significantly less than 1.2 mW.

While this invention has been particularly shown and described with references to example embodiments thereof, it will be understood by those skilled in the art that various changes in form and details may be made therein without departing from the scope of the invention encompassed by the appended claims.

What is claimed is:

1. A temperature sensor comprising:
an open-loop delay line comprising plural delay cells and a multiplexer configured to select a first number of the plural delay cells;
a delay-locked loop comprising plural delay cells and a multiplexer configured to select a second number of the plural delay cells;
a clock coupled to an input of the open-loop delay line and to an input of the delay-locked loop;
a phase detector having a first input coupled to an output of the open-loop delay line and a second input coupled to an output of the delay-locked loop; and
a finite state machine configured to detect a transition in the output of the phase detector;
the temperature sensor further comprising a first phase interpolator coupled between the output of the open-loop delay line and the first input of the phase detector and a second phase interpolator coupled between the output of the delay-locked loop and the second input of the phase detector.

2. A temperature sensor comprising:
an open-loop delay line comprising plural delay cells and a multiplexer configured to select a first number of the plural delay cells;
a delay-locked loop comprising plural delay cells and a multiplexer configured to select a second number of the plural delay cells;
a clock coupled to an input of the open-loop delay line and to an input of the delay-locked loop;
a phase detector having a first input coupled to an output of the open-loop delay line and a second input coupled to an output of the delay-locked loop; and
a finite state machine configured to detect a transition in the output of the phase detector;
the temperature sensor having a calibration mode in which temperature and the second number of delay cells are fixed and the first number of delay cells is increased until a total delay through the open delay line equals to a total delay through the delay-locked loop to derive a calibrated number of delay cells of the open-loop delay line.

3. The temperature sensor of claim 2 having a measurement mode in which the first number of delay cells is fixed at the calibrated number and the second number of delay cells is increased until the total delay through the delay-locked loop equals the total delay through the open-loop delay line to derive a measurement number of delay cells of the delay-locked loop, the measurement number having a relationship to a corresponding environment temperature.

4. A temperature sensor comprising:
an open-loop delay line comprising plural delay cells and a multiplexer configured to select a first number of the plural delay cells;
a delay-locked loop comprising plural delay cells and a multiplexer configured to select a second number of the plural delay cells;
a clock coupled to an input of the open-loop delay line and to an input of the delay-locked loop;
a phase detector having a first input coupled to an output of the open-loop delay line and a second input coupled to an output of the delay-locked loop; and
a finite state machine configured to detect a transition in the output of the phase detector;
the temperature sensor having a measurement mode in which the first number of delay cells is fixed at a calibrated number and the second number of delay cells is increased until the total delay through the delay-locked loop equals the total delay through the open-loop delay line to derive a measurement number of delay cells of the delay-locked loop, the measurement number having a relationship to a corresponding environment temperature.

5. A method comprising:
coupling a clock signal to an input of an open-loop delay line and to an input of a delay-locked loop, the open-loop delay line comprising plural delay cells and a multiplexer configured to select a first number of the plural delay cells, the delay-locked loop comprising plural delay cells and a multiplexer configured to select a second number of the plural delay cells;
coupling a first input of a phase detector to an output of the open-loop delay line;
coupling a second input of the phase detector to an output of the delay-locked loop; and detecting a transition in the output of the phase detector indicative of an environment temperature;

the method further comprising coupling a first phase interpolator between the output of the open-loop delay line and the first input of the phase detector and coupling a second phase interpolator between the output of the delay-locked loop and the second input of the phase detector.

6. A method comprising:

coupling a clock signal to an input of an open-loop delay line and to an input of a delay-locked loop, the open-loop delay line comprising plural delay cells and a multiplexer configured to select a first number of the plural delay cells, the delay-locked loop comprising plural delay cells and a multiplexer configured to select a second number of the plural delay cells;

coupling a first input of a phase detector to an output of the open-loop delay line;

coupling a second input of the phase detector to an output of the delay-locked loop; and detecting a transition in the output of the phase detector indicative of an environment temperature;

the method further comprising, in a calibration mode, fixing temperature and the second number of delay cells and increasing the first number of delay cells until a total delay through the open delay line equals to a total delay through the delay-locked loop to derive a calibrated number of delay cells of the open-loop delay line.

7. The method of claim 6 further comprising, in a measurement mode, fixing the first number of delay cells at the calibrated number and increasing the second number of delay cells until the total delay through the delay-locked loop equals the total delay through the open-loop delay line to derive a measurement number of delay cells of the delay-locked loop, the measurement number having a relationship to a corresponding environment temperature.

8. A method comprising:

coupling a clock signal to an input of an open-loop delay line and to an input of a delay-locked loop, the open-loop delay line comprising plural delay cells and a multiplexer configured to select a first number of the plural delay cells, the delay-locked loop comprising plural delay cells and a multiplexer configured to select a second number of the plural delay cells;

coupling a first input of a phase detector to an output of the open-loop delay line;

coupling a second input of the phase detector to an output of the delay-locked loop; and detecting a transition in the output of the phase detector indicative of an environment temperature;

the method further comprising, in a measurement mode, fixing the first number of delay cells at a calibrated number and increasing the second number of delay cells until the total delay through the delay-locked loop equals the total delay through the open-loop delay line to derive a measurement number of delay cells of the delay-locked loop, the measurement number having a relationship to a corresponding environment temperature.

* * * * *